United States Patent [19]

Werner

[11] Patent Number: 5,719,431
[45] Date of Patent: Feb. 17, 1998

[54] INTEGRATED DRIVER CIRCUIT CONFIGURATION FOR AN INDUCTIVE LOAD ELEMENT

[75] Inventor: Wolfgang Werner, München, Germany

[73] Assignee: Siemens Aktiengesellschaft, Munich, Germany

[21] Appl. No.: 417,825

[22] Filed: Apr. 6, 1995

[30] Foreign Application Priority Data

Apr. 6, 1994 [DE] Germany ............... 44 11 869.4

[51] Int. Cl.$^6$ ............... H01L 29/00; H01L 27/082
[52] U.S. Cl. ............................ 257/531; 257/556
[58] Field of Search ................. 257/375, 373, 257/531, 556, 560, 578, 579, 590, 494, 337, 341, 343

[56] References Cited

U.S. PATENT DOCUMENTS

| | | | |
|---|---|---|---|
| 4,044,373 | 8/1977 | Nomiya et al. | 257/373 |
| 4,496,849 | 1/1985 | Kotowski | 257/547 |
| 5,317,180 | 5/1994 | Hutter et al. | 257/337 |
| 5,418,386 | 5/1995 | Dos Santos, Jr. et al. | 257/556 |
| 5,449,936 | 9/1995 | Paparo et al. | 257/337 |
| 5,455,447 | 10/1995 | Hutter et al. | 257/556 |
| 5,514,901 | 5/1996 | Peppiette et al. | 257/547 |

FOREIGN PATENT DOCUMENTS

| | | | |
|---|---|---|---|
| 0284979 | 10/1988 | European Pat. Off. | |
| 0325342 | 7/1989 | European Pat. Off. | |
| 0382865 | 8/1990 | European Pat. Off. | |
| 0424926 | 5/1991 | European Pat. Off. | |
| 273 722 | 11/1989 | German Dem. Rep. | 257/373 |
| 3018848 | 2/1989 | Germany. | |
| 59-152660 | 8/1984 | Japan | 257/373 |
| 1 533 569 | 11/1978 | United Kingdom. | |

OTHER PUBLICATIONS

Ghandhi, *VLSI Fabrication Principles: Silcon and Gallium Arsenide*, Fig. 1.11, p.28.
IBM Technical Disclosure Bulletin vol. 19 No. 2, Jul. 1976, p. 569, "Open–Collector Structure Lateral. . .".
IEEE Transactions of Electron Devices, vol. ED–34, No. 10, Oct. 1987, pp. 2156–2164 (Lewis et al.); IEEE Journal of Solid–State Circuits, vol. SC–8, No. 6, Dec. 1973, pp. 419–427 (Davis).

*Primary Examiner*—Ngân V. Ngô
*Attorney, Agent, or Firm*—Herbert L. Lerner; Laurence A. Greenberg

[57] ABSTRACT

In one embodiment, an integrated driver circuit configuration for an inductive load element includes a highly doped substrate of p-conductivity, an epitaxial layer having the same conductivity type as the substrate and being applied on the substrate, an output terminal for connecting the inductive load element, a plurality of insulated wells being disposed in the epitaxial layer and having a well associated with the output terminal, and an n-doped region laterally surrounding the well associated with the output terminal. In another embodiment, the integrated driver circuit configuration for the inductive load element includes a highly doped substrate of p-conductivity, an epitaxial layer applied on the substrate, a plurality of insulated wells having an n-doped well, an n-doped region laterally surrounding the n-doped well, and an output terminal for connecting the inductive load element. An npn transistor has an emitter formed by the n-doped well, a collector formed by the n-doped region, and a base formed by the epitaxial layer.

6 Claims, 1 Drawing Sheet

INTEGRATED DRIVER CIRCUIT CONFIGURATION FOR AN INDUCTIVE LOAD ELEMENT

BACKGROUND OF THE INVENTION

1. Field of the Invention

The invention relates to an integrated driver circuit configuration for an inductive load element, having a substrate, a plurality of insulated wells, and an output terminal for connecting the load element.

Integrated circuit configurations with power transistors currently switch currents of up to 30 A. Not only ohmic and capacitive but also inductive loads are driven thereby. In integrated power configurations with a p-substrate and n-doped wells disposed in it, wherein the wells receive the electrical components, the resultant pn junction must always be biased in the depletion direction, so that the wells can be effectively insulated from one another. Typically, the substrate is therefore connected to the lowest potential of the circuit.

On the other hand, it is known that inductive loads or loads with an inductive component generate a countervoltage, if a sudden interruption in the current flowing through them occurs, as is discussed in more detail below with regard to FIG. 3.

The problem described above is known from European Patent Application 0 284 979 A2, in which it is solved by connecting the substrate through respective diodes to the output terminal for connecting the inductive load on one hand and to the reference terminal for connection to a reference potential on the other hand.

SUMMARY OF THE INVENTION

It is accordingly an object of the invention to provide an integrated driver circuit configuration for an inductive load element, which overcomes the hereinafore-mentioned disadvantages of the heretofore-known devices of this general type.

With the foregoing and other objects in view there is provided, in accordance with the invention, an integrated driver circuit configuration for an inductive load element, comprising a highly doped substrate of p-conductivity; an epitaxial layer having the same conductivity type as the substrate and being applied on the substrate; an output terminal for connecting an inductive load element; a plurality of insulated wells being disposed in the epitaxial layer, including a well associated with the output terminal; and an n-doped region laterally surrounding the well associated with the output terminal.

In accordance with another feature of the invention, the epitaxial layer has a given acceptor doping, and the substrate has an acceptor doping being at least two orders of magnitude greater than the given acceptor doping.

In accordance with a further feature of the invention, the substrate and the epitaxial layer define a junction region in which an electric drift field is created upon decommutation of the inductive load element.

With the objects of the invention in view, there is also provided an integrated driver circuit configuration for an inductive load element, comprising a highly doped substrate of p-conductivity; an epitaxial layer applied on the substrate; a plurality of insulated wells, including an n-doped well; an n-doped region laterally surrounding the n-doped well; an output terminal for connecting an inductive load element; and an npn transistor having an emitter formed by the n-doped well, a collector formed by the n-doped region, and a base formed by the epitaxial layer.

The advantage of the invention is that an integrated circuit configuration with such characteristics merely requires a wafer of a different type for producing the integrated circuit, but otherwise the course of the process for producing the integrated circuit remains unchanged.

Other features which are considered as characteristic for the invention are set forth in the appended claims.

Although the invention is illustrated and described herein as embodied in an integrated driver circuit configuration for an inductive load element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2b is a substitute circuit diagram for FIG. 2a; and

DESCRIPTION OF THE PREFERRED EMBODIMENTS

Figure 3:
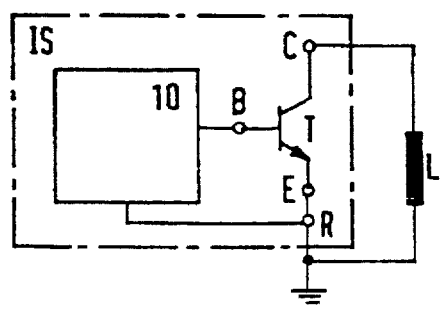
FIG. 3 is a known basic circuit diagram used to explain the problem solved by the invention.

Referring now to the figures of the drawing in detail and first, particularly, to FIG. 3 thereof, there is seen a known integrated circuit in which a countervoltage is generated upon the occurrence of a sudden interruption in current flowing through inductive loads or loads with an inductive component. An integrated circuit IS contains a power transistor T and its driver circuit 10. An inductive load L has one terminal connected to an output terminal C and another terminal connected to reference potential. When the transistor T is switched off, an n well connected to the output terminal C (collector) assumes a negative potential. In consequence, a minority carrier current on the order of magnitude of the switching current is injected into a p substrate. However, in the neutral substrate, the minority carriers move only because of a concentration drop. The back side of the chip and the n-wells on the surface of the integrated circuit act as a sink for the charge carriers. That creates so-called shunt or transverse currents. Some of the minority carriers recombine in the substrate. However, the crystal quality of the substrate is generally so good that only slight recombination speeds, or long carrier lives, are attained. As a consequence, the n wells into which the components of the integrated circuit are embedded draw correspondingly high shunt currents, causing malfunctions of the integrated circuit, for instance from unintended activation of bipolar pnp transistors.

Figure 1:
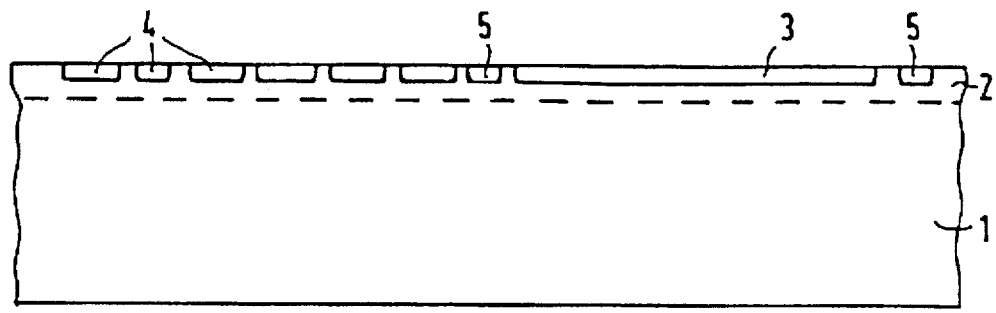
FIG. 1 is a fragmentary, diagrammatic, cross-sectional view of a wafer having the characteristics of the invention.

According to the invention, in FIG. 1 there is seen an epitaxial layer 2 applied over a substrate 1. Wells 3, 4 and 5 are made in the epitaxial layer, and individual elements of the integrated circuit configuration are provided in the wells. For example, the well 3 may contain a power transistor, while the wells 4 may contain driver transistors. Details of the structure of the individual elements of the integrated circuit are well known in the art. For instance, reference is made to the book by D. Widmann, H. Mader and H. Friedrich, entitled: Technologie hochintegrierter Schaltungen [VLSI Circuit Technology] published by Springer-Verlag, 1988.

In a first exemplary embodiment, the substrate 1 is of the p-conductivity type, with a high doping as compared with conventional p substrates, for instance with an acceptor doping of $>10^{17}$ cm$^{-3}$. The higher the doping, the more effective the attainable result. For comparison, conventional p substrates have an acceptor doping of approximately $10^{15}$ cm$^{-3}$. The epitaxial p layer 2 is applied with an acceptor doping of approximately $1 \times 10^{15}$ cm$^{-3}$ over the p$^+$ substrate. Like the components to be produced subsequently, in this epitaxial layer the wells 3–5 can be made without any change in the production process being employed for a p substrate for the integrated circuit elements. The configuration functions as an npn transistor with the n well 3 as its emitter, the p-epitaxial and p$^+$-substrate as its common base, and the well 5 as its collector. The p$^+$ substrate acts like a mirror at which the charge carriers are reflected and therefore do not penetrate the substrate.

Upon decommutation of an inductive load connected to the output terminal of the integrated circuit configuration, the drift field created by the p$^+$p junction between the substrate 1 and the epitaxial layer 2 dramatically reduces the minority carriers injected into the substrate. The minority carriers preferentially move laterally within the interstice between the p$^+$ substrate 1 and the n well 5. In the exemplary embodiment it is contemplated for the n well 5 to act as a protective ring, which sucks away the injected minority carriers. No impairment in the electrical elements disposed outside the protective ring 5 occurs.

Minority carriers that can nevertheless penetrate the p$^+$-doped substrate must expect a considerably shorter carrier life than in a lower doped p substrate, and therefore do not have a harmful effect on the function of the circuit.

With respect to the geometrical thickness, it is provided that the total thickness of the wafer in FIG. 1 amounts to approximately 300 μm, and that the intermediate region of the epitaxial layer between the wells 3–5 and the substrate 1 is on the order of magnitude of from 3 to 10 μm.

A second embodiment of the invention can also be explained with reference to FIG. 1, except that in this case the substrate 1 has n-doping, and the wells 5 do not suck away any charge carrier. The doping of the n substrate is not critical to suppressing the shunt current, and therefore it can be oriented to other given aspects instead. The layer thickness and the doping of the epitaxial p layer 2 is typically chosen to be similar to those of the first exemplary embodiment.

In the case of the minority carrier injection through the well 3, initially into the epitaxial layer 2 and then into the substrate 1, the charge carriers in the n substrate are majority carriers and therefore are harmless in terms of the problem described.

Figure 2A:
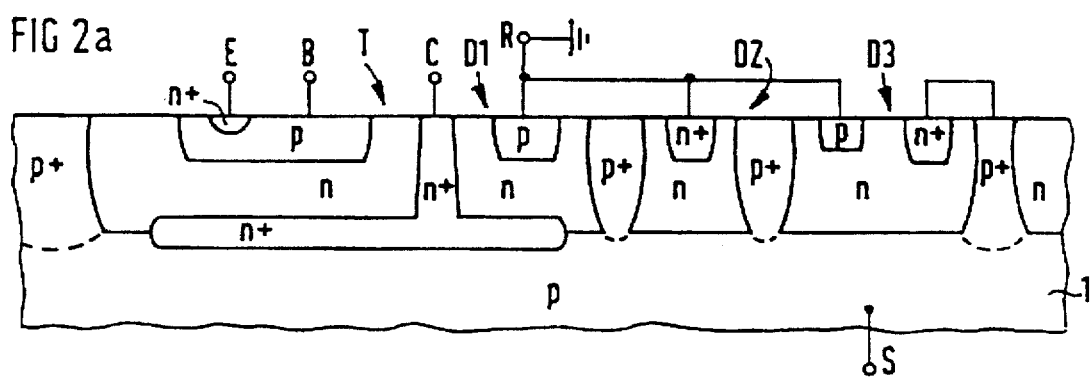
FIG. 2a is a fragmentary, cross-sectional view of a wafer used for explaining a circuit configuration.
Figure 2B:
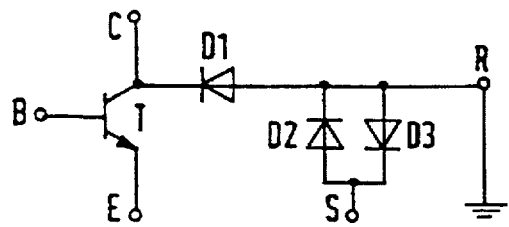

A third exemplary embodiment shown in FIG. 2a and FIG. 2b contemplates that n-doped wells are formed in a p-doped substrate. These wells are electrically insulated from one another by respective highly doped p$^+$ insulation trenches. In a first well, it is assumed that a bipolar power transistor T is produced by conventional technology, with an emitter terminal E, a base terminal B and a collector terminal C. The invention contemplates that a diode D1, as a nonlinear element, is connected in the depletion direction between the n well acting as a collector and a reference terminal R for connection to a reference potential. To that end, a p-doped region is made in the n well and connected to the reference potential. Correspondingly, it is naturally also possible in an MOS transistor to connect the source or drain terminal to reference potential, that is to ground, through this kind of diode D1. In the case of charge carrier injection that leads to a negative n well, the shunt or transverse current can flow out through the diode D1. However, that is possible only if the substrate can follow or float in terms of potential. To that end, it is provided that the reference terminal R is connected to the substrate S through two antiparallel-connected diodes D2 and D3.

The invention which is described in detail with respect to the exemplary embodiments effectively and reliably protects the integrated circuit for driving an inductive load against the problems described, and in particular against a malfunction of the circuit configuration. Moreover, the invention can be made simply and economically, and the production process for the integrated circuit elements typically need not be changed. Instead, at most a change of layout is contemplated. The actual process sequence can remain the same.

I claim:

1. An integrated driver circuit configuration for an inductive load element, comprising:

a highly doped substrate of p-conductivity;

an epitaxial layer having the same conductivity type as said substrate and being applied on said substrate;

power transistor having an output terminal for connecting an inductive load element;

a plurality of insulated wells being disposed in said epitaxial layer, including a well in which said power transistor is arranged; and an n-doped region laterally surrounding said well associated with said output terminal.

2. The configuration according to claim 1, wherein said epitaxial layer has a given acceptor doping, and said substrate has an acceptor doping being at least two orders of magnitude greater than said given acceptor doping.

3. The configuration according to claim 1, wherein said substrate and said epitaxial layer define an interface region in which an electric drift field is created, said drift field being operative for reducing the injection of minority carriers into said substrate upon decommutation of the inductive load element.

4. An integrated driver circuit configuration for an inductive load element, comprising:

a highly doped substrate of p-conductivity;

an epitaxial layer applied on said substrate;

a plurality of insulated wells, including an n-doped well, and a power transistor having an output terminal, disposed in said n-doped well;

an n-doped region laterally surrounding said n-doped well;

connecting means for connecting the inductive load element with said output terminal; and an npn transistor having an emitter formed by said n-doped well, a collector formed by said n-doped region, and a base formed by said epitaxial layer.

5. An integrated driver circuit configuration for an inductive load element, comprising:

a highly doped substrate of p-conductivity;

an epitaxial layer having the same conductivity type as said substrate and being applied on said substrate;

a power transistor having an output terminal;

connecting means for connecting said output terminal with an inductive load element;

a plurality of insulated wells being disposed in said epitaxial layer, including a well in which said power transistor is arranged; and an n-doped region laterally surrounding said well associated with said output terminal.

6. An integrated driver circuit configuration for an inductive load element, comprising:

a highly doped substrate of p-conductivity;

an epitaxial layer having the same conductivity type as said substrate and being applied on said substrate;

a power transistor having an output terminal connected to an inductive load element;

a plurality of insulated wells being disposed in said epitaxial layer, including a well in which said power transistor is arranged; and an n-doped region laterally surrounding said well associated with said output terminal.

* * * * *